(12) United States Patent
Minamitani et al.

(10) Patent No.: US 6,572,005 B2
(45) Date of Patent: Jun. 3, 2003

(54) BUMP-JOINING METHOD

(75) Inventors: Shozo Minamitani, Ibaraki (JP);
Kazushi Higashi, Neyagawa (JP);
Kenji Takahashi, Suita (JP); Shinji Kanayama, Kashihara (JP); Hiroshi Wada, Osaka (JP); Takafumi Tsujisawa, Tokyonaka (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/964,404

(22) Filed: Sep. 28, 2001

(65) Prior Publication Data

US 2002/0008132 A1 Jan. 24, 2002

Related U.S. Application Data

(62) Division of application No. 09/354,087, filed on Jul. 15, 1999, now Pat. No. 6,321,973.

(30) Foreign Application Priority Data

Jul. 17, 1998 (JP) .......................................... 10-203526

(51) Int. Cl.⁷ ................................................. B23K 1/06
(52) U.S. Cl. .................................................. 228/110.1
(58) Field of Search ............................... 228/102, 103, 228/110.1, 111, 180.22, 180.21, 214, 1.1, 5.5; 438/613; 257/737, 738

(56) References Cited

U.S. PATENT DOCUMENTS

| | | |
|---|---|---|
| 4,048,004 A | 9/1977 | Watkins |
| 4,603,802 A | 8/1986 | Kurtz et al. |
| 5,197,371 A | 3/1993 | Van der Heijden et al. |
| 5,250,469 A | 10/1993 | Tanaka et al. |
| 5,323,952 A | 6/1994 | Kato et al. |
| 5,326,014 A | 7/1994 | Morita et al. |
| 5,443,200 A | 8/1995 | Arikado |
| 5,655,700 A | 8/1997 | Pham et al. |
| 5,686,353 A | 11/1997 | Yagi et al. |
| 5,884,835 A | 3/1999 | Kajiwara et al. |
| 5,934,996 A | 8/1999 | Nagai et al. |
| 6,051,450 A | 4/2000 | Ohsawa et al. |

*Primary Examiner*—Tom Dunn
*Assistant Examiner*—Jonathan Johnson
(74) *Attorney, Agent, or Firm*—Wenderoth, Lind & Ponack, L.L.P.

(57) ABSTRACT

The present invention provides a bump-joining apparatus, a bump-joining method, and a semiconductor component-manufacturing apparatus whereby bumps and electrode portions of circuit board are perfectly joined with higher join strength than in the conventional art. The apparatus includes a vibration generation device, a pressing device and a control unit, wherein bumps are pressed to electrode portions of a circuit board and vibrated with ultrasonic waves after reaching an initial contact area before reaching a join-completed-contact area at a completion of the joining, so that the bumps are more perfectly joined to the electrode portion than in the conventional art which vibrates the bump only after reaching the join-completed-contact area. Larger join strength is achieved than in the conventional art.

6 Claims, 10 Drawing Sheets

US 6,572,005 B2

BUMP-JOINING METHOD

This application is a Divisional of application Ser. No. 09/354,087, filed Jul. 15, 1999 now U.S. Pat. No. 6,321,973.

BACKGROUND OF THE INVENTION

The present invention relates to an apparatus and a method for joining bumps formed at electrodes of an electronic component to electrode portions on a circuit board, and a semiconductor component-manufacturing apparatus provided with the bump-joining apparatus.

In one way for electrically connecting and fixing electronic components onto a circuit board, there is carried out a method whereby bumps formed at electrodes of an electronic component are joined to electrode portions on a circuit board. For instance, a semiconductor component-manufacturing apparatus 1 shown in FIG. 11 is used to execute the bump-joining method, which roughly comprises a component feed apparatus 2, a bonding stage 3, a component reversal apparatus 4, a bump-joining apparatus 5 and a circuit board transfer apparatus 6.

The component feed apparatus 2 feeds semiconductor chips as an example of the electronic components, and the circuit board transfer apparatus 6 carries circuit boards in to and out from the semiconductor component-manufacturing apparatus 1. The bonding stage 3, where one of the circuit boards carried in by the circuit board transfer apparatus 6 is loaded to be subjected to the joining, can be moved in a Y-direction by a Y-axis robot 7. The bonding stage 3 heats the circuit board for the joining of bumps. The component reversal apparatus 4 holding one of the semiconductor chips supplied from the component feed apparatus 2 turns the semiconductor chip upside down so that bumps formed at electrodes of the semiconductor chip face the circuit board loaded on the bonding stage 3. The bump-joining apparatus 5 includes a holding device for holding the semiconductor chip, a Z-directional driving device 51 for moving the held semiconductor chip in a thicknesswise direction of the semiconductor, and an ultrasonic vibration generation device 9 which will be detailed later. The bump-joining apparatus 5 is mounted to an X-axis robot 8 to be moved in an X-direction by the X-axis robot 8, receiving the semiconductor chip from the component reversal apparatus 4, transferring the semiconductor chip to the bonding stage 3, driving the Z-axis driving device 51 thereby pressing the received and held semiconductor chip at a predetermined position of the circuit board loaded on the bonding stage 3 to join the bumps. A positioning of the semiconductor chip to be joined onto the circuit board is carried out by the X-axis robot 8 and Y-axis robot 7.

The bump-joining apparatus 5 is provided with the ultrasonic vibration generation device 9 which vibrates the bumps in the Y- or X-direction thereby generating heat of friction between the bumps and electrode portions on the circuit board to decrease a heating temperature of the bonding stage and steady the joining of the bumps. The ultrasonic vibration generation device 9 has, as shown in FIG. 12, a plurality of layered piezoelectric elements 91 and an ultrasonic horn 92 connected to one end portion of the piezoelectric elements 91. A vibration, e.g., in the Y-direction brought about when a voltage is impressed to the piezoelectric elements 91 is amplified by the ultrasonic horn 92. A nozzle 93 for holding of the semiconductor chip is fixed at the other end portion of the ultrasonic horn 92. The vibration of the piezoelectric elements 91 brings about ultrasonic vibration to the nozzle 93, i.e., semiconductor chip held by the nozzle 93. Although the piezoelectric elements 91 vibrate in the Y-direction in FIG. 12, while the vibration is conducted to the semiconductor chip, vibrations moving in various directions also occur. Consequently the semiconductor chip is actually vibrated in various directions although primarily vibrated in the Y-direction.

The conventional semiconductor component-manufacturing apparatus 1 constituted as above joins the bumps in a manner described hereinbelow.

The circuit board carried in by the circuit board transfer apparatus 6 is loaded and heated on the bonding stage 3. In the meantime, the semiconductor chip held by the component reversal apparatus 4 from the component feed apparatus 2 is moved by the bump-joining apparatus 5 to a mount position on the bonding stage 3. Each of bumps 11 before being joined has a configuration, for example, as shown in FIG. 13. Specifically, a diameter I of each bump 11 is approximately 100 μm, a height III of a base portion 11a is approximately 30–35 μm and a total height II of each bump 11 is approximately 70–75 μm.

Each bump 11 of the configuration is pressed to each electrode portion on the circuit board by the operation of the Z-directional driving device 51, pressed down as indicated in FIG. 14 and joined. A height IV of the bump 11 in FIG. 14 when pressed is nearly equal to the height III of the base portion 11a.

In the conventional semiconductor component-manufacturing apparatus 1, after the bump 11 is pressed in a state of FIG. 14 (which will be denoted by a reference numeral 12 hereinafter), the ultrasonic vibration generation device 9 is operated to vibrate each bump 12 with ultrasonic waves and join the pressed bump 12 to each electrode portion of the circuit board.

According to the conventional art described above, each contact-area between each bump 12 and each electrode portion 21 of the circuit board 20 is large because each bump 12 is started to be vibrated only after each bump 11 is pressed to be formed as the bump 12 in FIG. 14. In consequence, a sufficient scrub or friction cannot be attained in some cases between the bump 12 and electrode portion 21, resulting in insufficiency of heat of friction necessary for the joining between the bump 12 and the electrode portion 21. The bump 12 and the electrode portion 21 cannot be joined perfectly, with a resultant decrease in the join strength.

SUMMARY OF THE INVENTION

The present invention is devised to eliminate the above-discussed disadvantage and has for its object to provide an apparatus and a method for perfectly joining bumps and electrode portions of a circuit board with larger joint strength than in the conventional art, and a semiconductor component-manufacturing apparatus including the bump-joining apparatus.

In accomplishing this and other objects, according to a first aspect of the present invention, there is provided a bump-joining apparatus for joining bumps formed at an electronic component to electrode portions on a circuit board, which comprises:

a vibration generation device for generating relative vibrations between the bumps and the electrode portions, with the bumps facing the electrode portions;

a pressing device for moving the electronic component and the circuit board relative to each other in a direction to bring the bumps and the electrode portions close to each other, and pressing the bumps of the electronic component and the electrode portions to each other, so as to compress the bumps; and a control unit for controlling the pressing device to execute a pressing action control to change a contact-area of each of the bumps to each of the electrode portions through the compressing from an initial contact area corresponding to each of the bumps to a join-completed-contact area corresponding to each of the bumps at the completion of the joining which exceeds the initial contact area, and for controlling the vibration generation device to execute a vibration control to generate constant vibration from a time when the contact-area reaches the initial contact area to a time when the contact-area reaches the join-completed-contact area.

According to a second aspect of the present invention, there is provided a bump-joining method for joining bumps formed at an electronic component to electrode portions on a circuit board, which comprises:

with the bumps facing the electrode portions, performing a pressing operation to press the bumps and the electrode portions relatively so as to compress the bumps so that contact-areas between the bumps and the electrode portions change from initial contact areas to join-completed-contact areas at completion of the joining, with the join-completed-contact areas exceeding the initial contact areas; and generating a constant (i.e. substantially unchanging, invariable, or uniform) vibration relatively between the bumps and the electrode portions continuously (i.e., uninterrupted) from a time when the contact-area reaches the initial contact area to a time when the contact-area reaches the join-completed-contact area, to thereby join the bumps to the electrode portions.

A semiconductor component-manufacturing apparatus according to a third aspect of the present invention features the above bump-joining apparatus of the first aspect.

According to a fourth aspect of the present invention, there is provided a bump-joining apparatus for joining bumps formed at an electronic component to electrode portions on a circuit board, which comprises:

a vibration generation device for generating relative vibration between the bumps and the electrode portions, with the bumps facing the electrode portions;

a pressing device for moving the electronic component and the circuit board relative to each other in a direction to bring the bumps and the electrode portions close to each other, and pressing the bumps of the electronic component and the electrode portions to each other, so as to compress the bumps; and a control unit for controlling the vibration generation device and the pressing device to generate vibration before the bumps come in touch with the electrode portions until a contact-area of each of the bumps to each of the electrode portions reaches a join-completed-contact area at completion of the joining.

According to a fifth aspect of the present invention, there is provided a bump-joining method for joining bumps formed at an electronic component to electrode portions on a circuit board, which comprises:

with the bumps and electrode portions facing each other, performing a pressing operation to press the bumps and the electrode portions to each other relatively so as to compress the bumps so that contact-areas of the bumps to the electrode portions change to join-completed-contact areas at completion of the joining, wherein the join-completed contact areas exceed initial contact areas;

generating initial relative vibration between the bumps and the electrode portions, without causing misregistration of the bumps and the electrode portions, before the bumps come in contact with the electrode portions and until the contact-areas reach the initial contact areas; and generating constant (i.e., substantially unchanging, invariable or uniform) relative vibration, exceeding the initial vibration, between the bumps and the electrode portions continuously (i.e., uninterrupted) from a time when the contact-areas reach the initial contact-areas to a time when the contact-areas reach the join-completed contact areas, so as to join the bumps to the electrode portions.

In the bump-joining apparatus according to the first aspect of the present invention and the bump-joining method according to the second aspect of the present invention, the vibration generation device, the pressing device and the control unit are provided, and the electrode portions and the bumps are vibrated relatively from a time when each of the bumps obtains the initial contact area subsequent to the pressing to a time when the initial contact area changes to the join-completed-contact area. In comparison with the conventional art wherein the vibration is applied only after the join-completed-contact area is attained, the vibration in these aspects of the present invention effectively works to generate the heat of friction from the time when each contact-area between the bumps and the electrode portions is small. So, each of the bumps is joined at an increased contact-area to each of the electrode portions. The bumps and the electrode portions are perfectly joined throughout changing of the contact-area of each of the bumps to each of the electrode portions when the contact-area becomes the join-completed-contact area. Thus larger joint strength is achieved relative the conventional art.

The semiconductor component-manufacturing apparatus according to the third aspect of the present invention comprises the bump-joining apparatus and the bump-joining method according to the first and second aspects of the present invention, whereby the electronic component and the circuit board of a produced semiconductor component are joined with larger strength than in the conventional art.

According to the bump-joining apparatus of the fourth aspect of the present invention, the bumps and the electrode portions are vibrated relatively before coming in contact with each other. Even when the bumps are nonuniform in height, the bumps can be surely joined to the electrode portions from the time when the bumps and the electrode portions come in contact with each other. Moreover, a time required for setting to achieve the initial contact area can be saved and consequently the Tact time is shortened.

In the bump-joining method according to the fifth aspect of the present invention, the vibration relatively applied to the bumps and the electrode portions is adapted to change in two levels, with the same effect as achieved by the bump-joining apparatus of the fourth aspect. The initial vibration is smaller than the vibration in the period from the initial contact area to the join-completed-contact area, thus decreasing the possibility that the holding of the electronic component is lost before the bumps and electrode portions are brought in contact with each other.

BRIEF DESCRIPTION OF THE DRAWINGS

These and other aspects and features of the present invention will become clear from the following description taken in conjunction with the preferred embodiment thereof with reference to the accompanying drawings, in which.

DETAILED DESCRIPTION OF THE PREFERRED EMBODIMENTS

Figure 1:
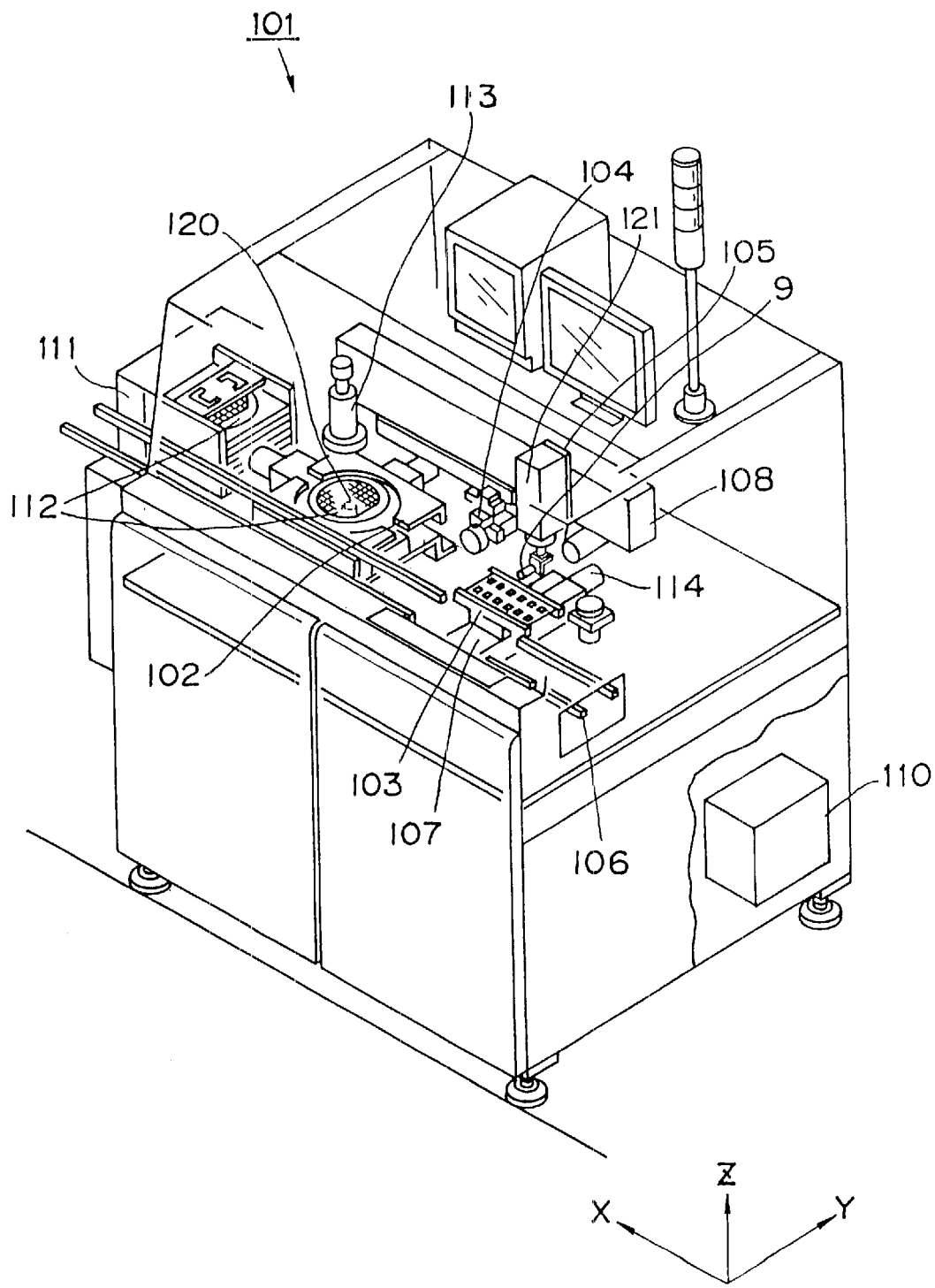
FIG. 1 is a perspective view of an example of a semiconductor component-manufacturing apparatus of an embodiment of the present invention.

A bump-joining apparatus, a bump-joining method carried out by the bump-joining apparatus, and a semiconductor component-manufacturing apparatus including the bump-joining apparatus according to a preferred embodiment of the present invention will be described hereinbelow with reference to the drawings throughout which like portions are designated by like reference numerals.

In the embodiment to be described below, a semiconductor chip obtained by the following method is exemplified as the "electronic component" mentioned in the foregoing "SUMMARY OF THE INVENTION". Bumps are formed at electrodes of integrated circuits formed on a semiconductor substrate such as a silicon wafer or the like, and then the integrated circuits are split individually, whereby the semiconductor chips are obtained. The electronic component is not limited to the semiconductor chip, and can be, for instance, a semiconductor component sealing the semiconductor chip with resin and having bumps formed on electrodes of the semiconductor component.

An ultrasonic vibration generation device 9 set at a bump-joining apparatus 105 and including piezoelectric elements 91 in the embodiment corresponds to the "vibration generation device" of the "SUMMARY OF THE INVENTION", but is not limited to this.

Regarding the vibration, it is not restricted to the ultrasonic vibration and any kind of ultrasonic vibration is possible that generates heat of friction between each of the bumps and each electrode portion of a circuit board corresponding to each bump, thereby decreasing a heating temperature of a bonding stage for the circuit board. Although the ultrasonic vibration changes depending on conditions such as a size of the semiconductor chip, the number of bumps, etc., the vibration may be used, for example, with an amplitude of approximately 0.5 μm.

The function of the "pressing device" described in the "SUMMARY OF THE INVENTION" is achieved by a voice coil motor 121 installed at the bump-joining apparatus 105 according to the embodiment. The "pressing device" is not necessarily the voice coil motor.

As is apparent from FIG. 1, a semiconductor component-manufacturing apparatus 101 according to the embodiment of the present invention is not different in structure from most of the semiconductor component-manufacturing apparatus 1 described earlier. The semiconductor component-manufacturing apparatus 101 typically features a control unit 110 which realizes a bump-joining method to be described in detail later. Specifically, the semiconductor component-manufacturing apparatus 101 roughly comprises a component feed apparatus 102, a bonding stage 103, a component reversal apparatus 104, the bump-joining apparatus 105, a circuit board transfer apparatus 106, and the control unit 110. The component feed apparatus 102 corresponds to the above-described conventional component feed apparatus 2. The bonding stage 103 corresponds to the conventional bonding stage 3. The component reversal apparatus 104 corresponds to the conventional component reversal apparatus 4. The bump-joining apparatus 105 corresponds to the conventional bump-joining apparatus 5. The circuit board transfer apparatus 106 corresponds to the conventional circuit board transfer apparatus 6. Here the detailed description for the component feed apparatus 102, bonding stage 103, component reversal apparatus 104, bump-joining apparatus 105, and circuit board transfer apparatus 106 will therefore be omitted except for the following supplementary description.

To the component feed apparatus 102 are supplied from a magazine lifter 111 a semiconductor wafer 112 of a state in which individual integrated circuits are scribed with having bumps formed at electrodes of the individual integrated circuits of the semiconductor wafer 112. The component feed apparatus 102 stretches the wafer 112 and divides the wafer into semiconductor chips. A wafer recognition apparatus 113 set above the component feed apparatus 102 picks up images of states of the wafer 112 supplied to the component feed apparatus 102 and individual semiconductor chips, and feeds information of the picked-up images to the control unit 110. Although the component feed apparatus 102 in the embodiment is constituted in the form described above because the semiconductor chip is exemplified as the electronic component, the component feed apparatus is changed into a different form if the electronic component to be processed is a different kind.

Naturally, a circuit formation portion of the wafer 112 with the bumps is faced upward. A plunging device 120 of the component feed apparatus 102 plunges up each of the divided semiconductor chips in its thicknesswise direction. The component reversal apparatus 104 holds the chips one by one and turns each chip upside down so that the bumps face the electrode portions 21 of the circuit board 20.

In the embodiment, the wafer 112 has a base formed of LiTaO₃, LiNbO₃ or the like ferroelectric body, and the bump is formed of gold.

Figure 3:
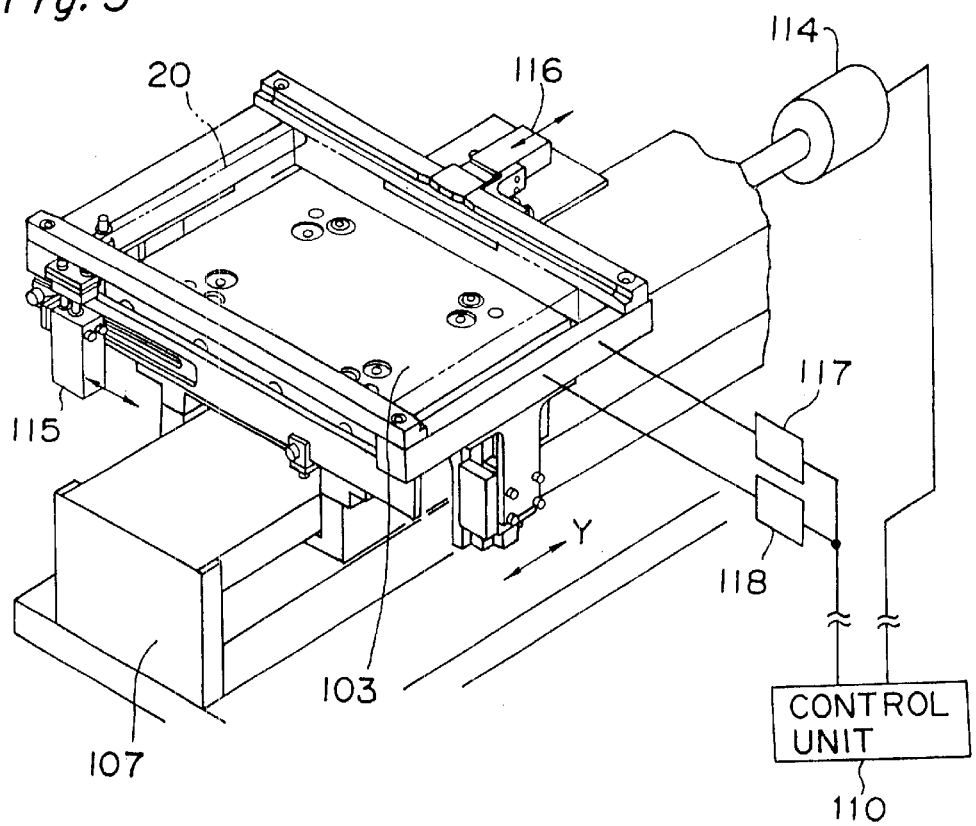
FIG. 3 is an enlarged perspective view of a portion of a bonding stage in FIG. 1.

The bonding stage 103 is constructed in a ball screw structure as indicated in FIG. 3. The bonding stage 103 is slid in a Y-direction by a Y-axis robot 107, having a motor 114 as a driving unit. For enabling the circuit board 20 to be loaded on the bonding stage 103, in other words, for making the bonding stage 103 conform in size with the circuit board 20 supplied from the circuit board transfer apparatus 106, the bonding stage 103 is equipped with a substrate regulation unit 115 which holds an edge portion of the circuit board 20 in the Y-direction and can move in the X-direction, and a substrate regulation unit 116 which holds an edge portion of the circuit board 20 in the X-direction and can move in the Y-direction. The bonding stage 103 has a suction path for sucking and holding the circuit board 20. The suction path communicates with a suction apparatus 117. A heating apparatus 118 is attached to the bonding stage 103 to heat the circuit board 20 to approximately 150° C. for joining the bumps.

Figure 2:
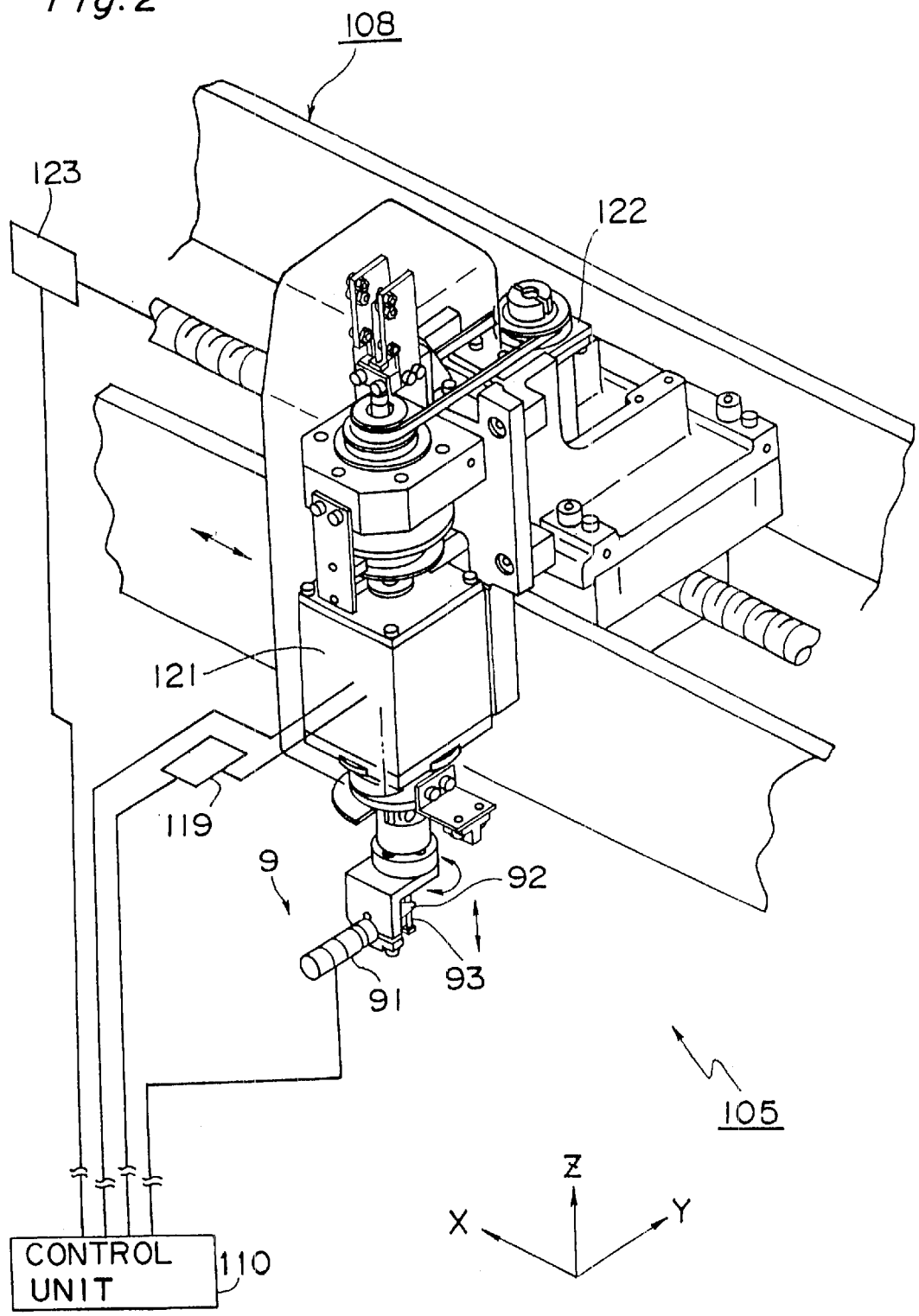
FIG. 2 is an enlarged perspective view of a portion of a bump-joining apparatus in the semiconductor component-manufacturing apparatus of FIG. 1.
Figure 12:
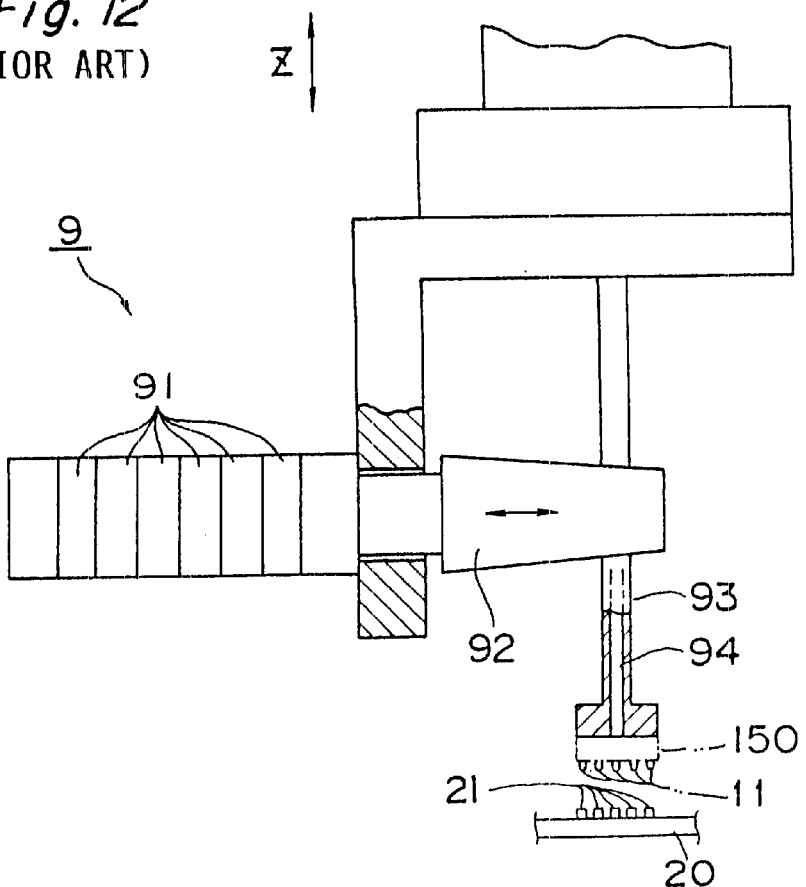
FIG. 12 is a diagram of a holding portion for semiconductor chips and a vibration generation device in the bump-joining apparatus.

The bump-joining apparatus 105 includes the ultrasonic vibration generation device 9 and semiconductor chip-holding nozzle 93 set at a lower end portion as depicted earlier with reference to FIG. 12. Still referring to FIG. 12, a suction path 94 is formed in the nozzle 93 along with an axial direction of the nozzle 93 to suck and hold the semiconductor chip 150. The suction path 94 communicates with a suction apparatus 119. The semiconductor chip 150 is held not necessarily through a suction action by the nozzle 93, and can be held, e.g., in a mechanical way. In moving the semiconductor chip 150 in a direction (Z-direction in the embodiment) in which the bumps 11 and the electrode portions 21 facing the bumps come close to each other as shown in FIG. 12, thereby pressing the bumps 11 and the electrode portions 21 to join the bumps and the electrode portions 21 of the circuit board 20, at this time, a driving device, specifically, the known voice coil motor (VCM) 121 shown in FIG. 2 is used in the embodiment. The bump-joining apparatus 105 is also equipped with a motor 122 for rotating the nozzle 93 in a direction about an axis thereof.

The operation of the bump-joining apparatus 105 is controlled by the control unit 110 which will be described later.

An X-axis robot 108 for moving the above bump-joining apparatus 105 in the X-axis direction is of a ball screw structure in the embodiment as shown in FIG. 2, and has a motor 123 as a driving unit.

The control unit 110 is electrically connected to each of the above-described apparatuses, for example, the component feed apparatus 102, the bonding stage 103, the component reversal apparatus 104, the bump-joining apparatus 105 including the voice coil motor 121 and the piezoelectric elements 91, and the circuit board transfer apparatus 106, etc., thereby controlling operations of these apparatus. In the embodiment, one control unit 110 is set for the entire semiconductor component-manufacturing apparatus 101 to control, e.g., the bump joining operation, etc. However, the control unit may be set corresponding to each of the apparatuses, for instance, for the bump-joining apparatus 105 to execute control of the bump join operation.

The control of the bump joining operation carried out by the control unit 110 which characterizes the embodiment will be discussed in detail hereinbelow, while the control by the control unit 110 of the other apparatuses is omitted from the description because the control of the other apparatuses is equal to in the conventional art.

Figure 13:
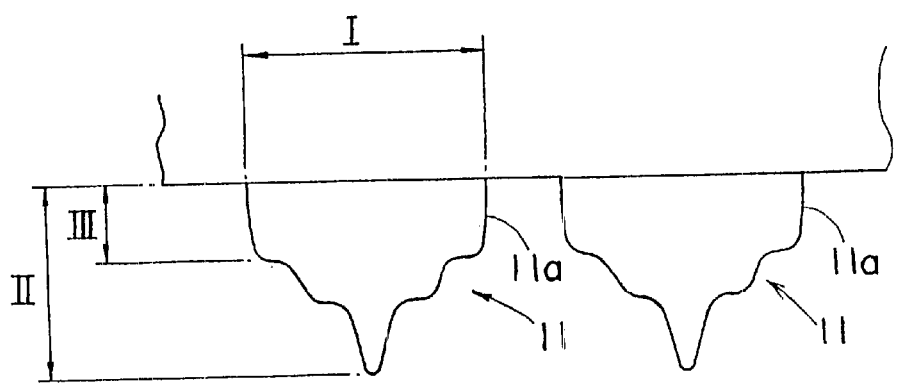
FIG. 13 is a diagram of a shape of the bump formed at an electronic component.
Figure 14:
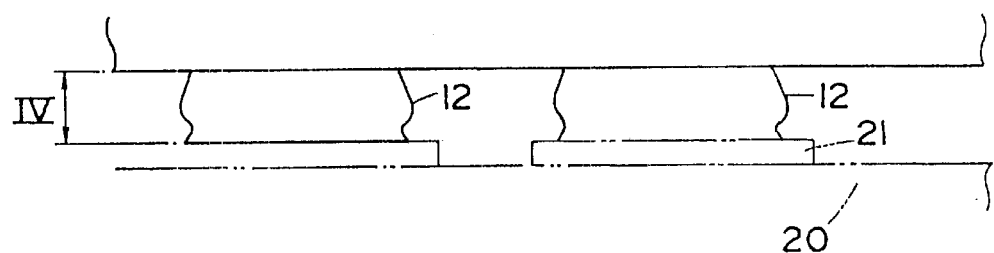
FIG. 14 is a diagram of the pressed bump when reaching a join-completed-contact area at the completion of the joining.

In the conventional art, only after the bumps 11 of FIG. 13 are pressed to the electrode portions 21 of the circuit board 20 and thus compressed to form the bumps 12, of FIG. 14, the ultrasonic vibration generation device 9 is operated to apply the ultrasonic vibration to the bump 12.

Figure 4:
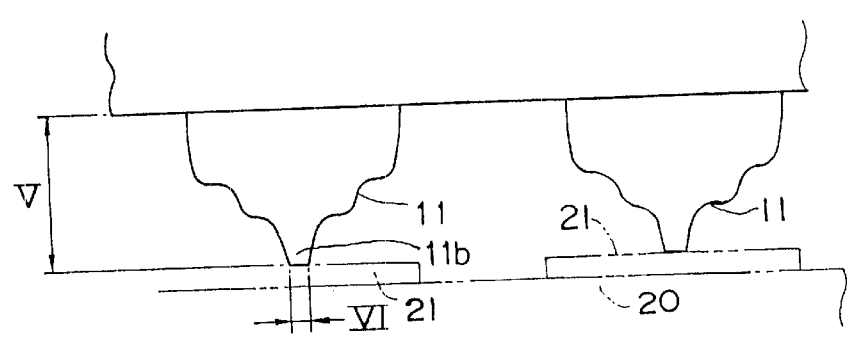
FIG. 4 is a diagram showing a state where a bump pressed by the bump-joining apparatus of FIG. 1 reaches an initial contact area.

In contrast, according to the embodiment, the ultrasonic vibration generation device 9 is operated to apply the vibration of the device 9 to the bumps 11, 12 from a time point when the bumps 11 are pressed to the electrode portions 21 into a state shown in FIG. 4 to a time when the bumps 11 are turned into the bumps 12. This manner of control causes the ultrasonic vibration to act on the bumps 11, 12 while changing a contact-area of each of the bumps 11 with respect to each of the electrode portions 21. Thus, heat of friction resulting from the ultrasonic vibration is applied to the bumps 11, 12 throughout the changing of the contact-area, and accordingly the bumps 11, 12 are uniformly joined with the electrode portions 21. The bumps 12 can be integrated with the electrode portions 21 all over the contact area more firmly than in the conventional art.

Figure 6:
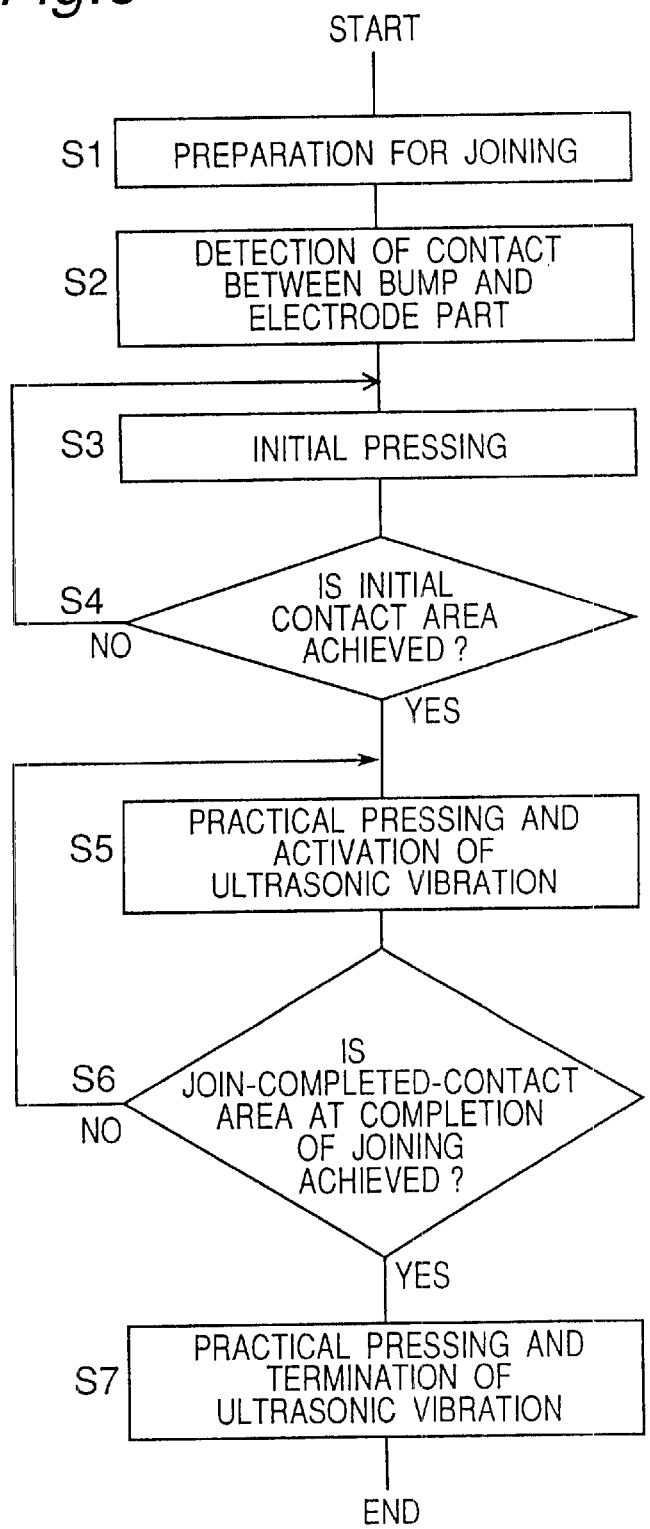
FIG. 6 is a flow chart of a bump-joining method carried out by the semiconductor component-manufacturing apparatus of FIG. 1.

The bump joining operation will be more fully depicted with reference to FIG. 6, etc.

The semiconductor chip 150 employed in the embodiment has 20 bumps 11 of gold. The electrode portions 21 to which the bumps are pressed are formed of gold as well. When a current is supplied to the voice coil motor 121, the nozzle 93 moves in the axial direction thereof, that is, the Z-direction which is equal to the thicknesswise direction of the semiconductor chip 150 sucked and held by the nozzle 93. In consequence, the bumps 11 of the semiconductor chip 150 are pressed to the electrode portions 21 of the circuit board 20. Information of a relationship of the current supplied to the voice coil motor 121 and a pressing force of the bumps pressing the electrode portions 21 subsequent to the supply of the current is stored in advance in the control unit 110. The control unit 110 obtains a load value of the pressing force from the current value fed to the voice coil motor 121. The load value is obtained in a known manner corresponding to a form of the above relationship information, for instance, a table, an operation formula, etc.

Specific values mentioned in the following description are based on an example where each of 20 gold bumps of one semiconductor chip 150 has a shape and a size described with reference to FIG. 13, and therefore the values are changeable when these conditions change.

In step 1 (e.g. denoted by S1 in FIG. 6) in FIG. 6, the control unit 110 controls operations of the X-axis robot 108 and Y-axis robot 107, and disposes the bumps 11 to face the electrode portions 21 for joining thereof. In step 2, the control unit 110 operates the voice coil motor 121 to bring the bumps 11 into touch with the electrode portions 21. The bumps and the electrode portions are started to be pressed in step 3, whereby the contact-area between each of the bumps 11 and each of the electrode portions 21 changes. Each leading end portion 11b of the bumps 11 is compressed as is clearly shown in FIG. 4. The contact-area of each bump 11 to each electrode portion 21, becomes an initial contact area respectively in step 4. In the embodiment, a height V in FIG. 4 is 60–65 μm and a diameter VI of a portion of each initial contact area is 5–10 μm.

Figure 5:
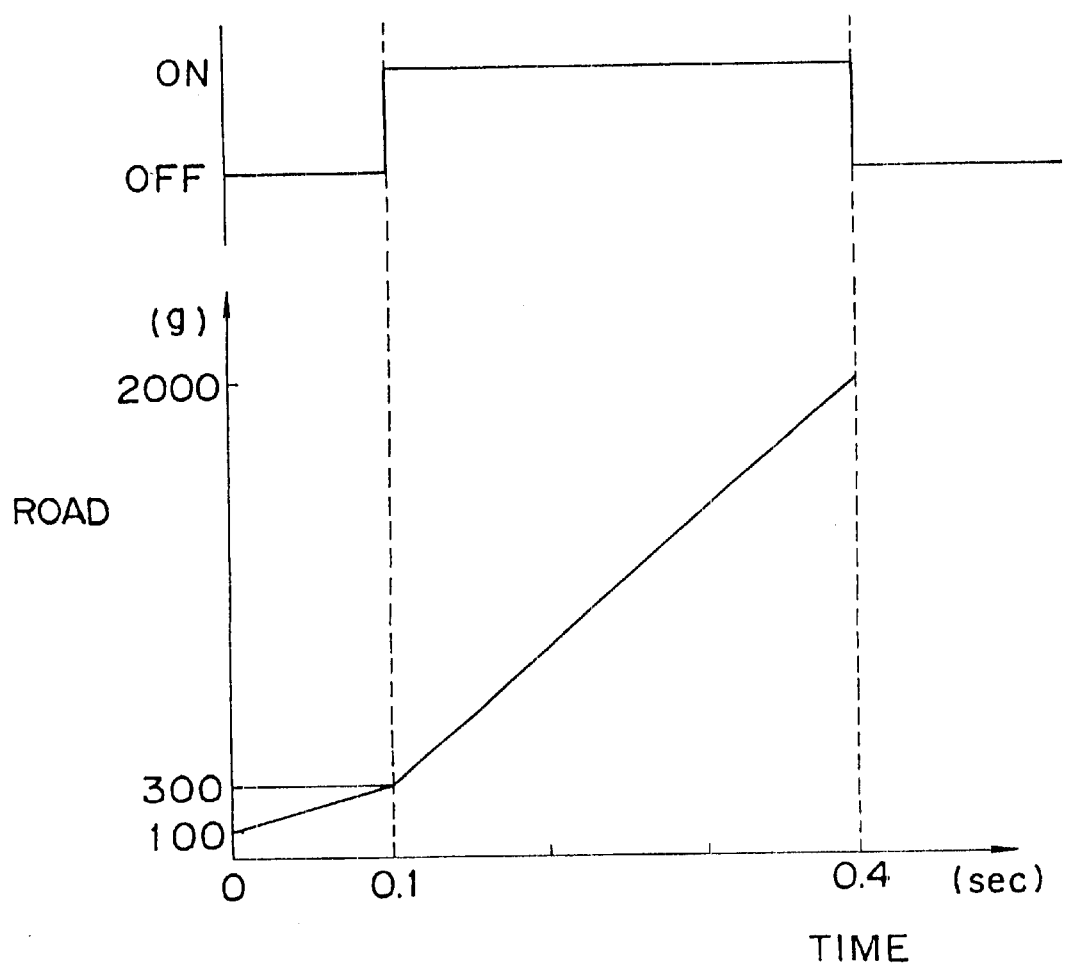
FIG. 5 is a graph of an example of control of a bump joining operation carried out by the semiconductor component-manufacturing apparatus of FIG. 1.

That the bumps 11 touch the electrode portions 21 and that the contact-areas of the bumps 11 reach the initial contact areas of the bumps 11 are detected by obtaining the aforementioned load value. That is, the control unit 110 detects the current value fed to the voice coil motor 121 and obtains the load value from the current value on the basis of the above relationship information. As indicated in FIG. 5, according to the embodiment, the control unit 110 recognizes the touch or contact when detecting the load of 100 g with 20 bumps, and judges that the initial contact areas are achieved when detecting the load of 300 g, i.e., 15 g per one bump 11. Since a tolerance of ±50 g is set in the embodiment, the control unit 110 judges that the bumps 11 lead to the initial contact areas when the load is included within a range of 300 g±50 g.

According to the embodiment, the control unit 110 performs time control so that the contact-areas change to the initial contact areas in 0.1 sec after the bumps 11 touch the electrode portions 21.

At a time point when the contact-areas become the initial contact areas, in step 5, the control unit 110 applies a voltage to the piezoelectric elements 91 of the ultrasonic vibration generation device 9, thereby causing the ultrasonic vibration to act on the nozzle 93, i.e., bumps 11 of the semiconductor chip 150 as well as pressing the bumps 11. The generated ultrasonic vibration in the embodiment has a frequency of 60 kHz, whereby a semiconductor chip holding portion of the nozzle 93 is vibrated with an amplitude of 1–2 $\mu$m. The ultrasonic vibration to the bumps 11 is continued until step 7 to be described later. The ultrasonic vibration with the above frequency is continued in a constant manner during the time. In other words, a constant (defined herein to mean substantially unchanging, invariable, or uniform) relative vibration of 60 kHz between the bumps 11 and the electrode portions 21 is generated continuously (defined herein to mean uninterrupted) from a time at which the contact areas of the bumps reach the initial contact areas to a time at which the contact areas reach completed contact areas, so as to join the bumps to the electrode portions.

The reason why the ultrasonic vibration is started from the time point when the contact-areas of the bumps 11 reach the initial contact areas of the bumps 11, not from a time point when the bumps 11 touch the electrode portions 21 is as follows: If the bumps 11 are vibrated in a state in which they each have a sharp leading end portion 11b as shown in FIG. 13, the bumps 11 and the electrode portions 21 are brought in point contact, causing the bumps 11 to loosely shift from the electrode portions 21. So, joining positions of the bumps 11 may become unstable. More specifically, if the bumps 11 are vibrated with the above amplitude of 1–2 $\mu$m with the leading end portions of the bumps 11 being pointed in shape, the bumps 11 slide with respect to the electrode portions 21. As a result, a shift of not smaller than ±50 $\mu$m is introduced, although the bumps and the electrode portions are joined generally with an accuracy of ±15 $\mu$m with respect to a normal joining position.

Therefore, each initial contact area is a minimum area to prevent the positional shift i.e., misregistration between each bump 11 and each electrode portion 21. In a relationship between the initial contact areas and a magnitude of the ultrasonic vibration, for example, the initial contact area of one bump 11 is approximately 30–40% the diameter of one bump 11 when the amplitude is 1 $\mu$m.

In step 6, the current is supplied to the voice coil motor 121 to apply the load to the bumps 11 so as to change each of the contact-areas to each of join-completed-contact areas (i.e. contact areas between the bumps and electrodes after completion of the joining thereof) at completion of the joining of the bumps 12 to the electrode portions 21 as shown in FIG. 14. Each join-completed-contact area has an area exceeding each initial contact area. In the embodiment, the load is applied to the bumps 11 in step 6 with a constant rate of change as indicated in FIG. 5. The load when the contact-areas reach the join-completed-contact areas is 100 g per one bump, i.e., 2000 g in total. The control unit 110 controls the pressing action so that it takes 0.3 sec to achieve the join-completed-contact areas after the contact-areas become the initial contact areas.

When the load becomes 2000 g, in other words, the contact-areas reach the join-completed-contact areas in step 7, the control unit 110 terminates the pressing action of the bumps 12 to the electrode portions 21 and at the same time terminates the ultrasonic vibration to the bumps 12.

Figure 7:
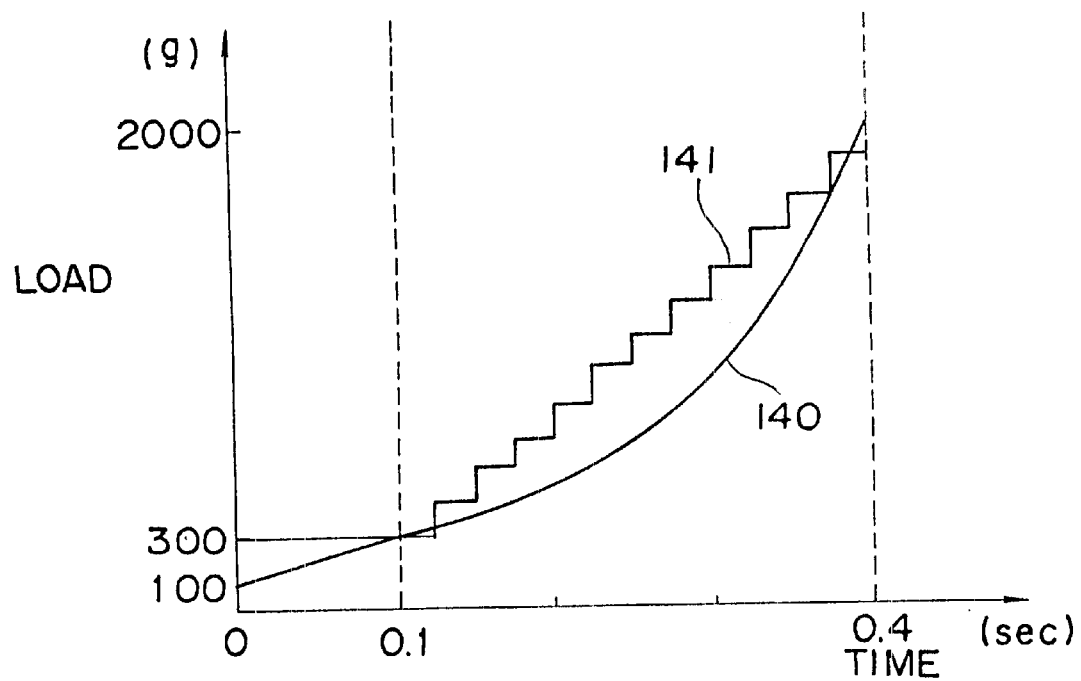
FIG. 7 is a graph of another example of control of the bump joining operation carried out by the semiconductor component-manufacturing apparatus of FIG. 1.

In the embodiment, the control unit 110 changes the load acting to the bumps 11 with the constant rate in step 6. However, the present invention is not limited to this arrangement; for instance, the load can be changed in a quadratic curve as represented by a reference numeral 140 in FIG. 7 or changed stepwise as indicated by a reference numeral 141.

On the other hand, although the pressing force to the bumps 11 is detected from the load value, in the embodiment, the present invention is not confined to this. From a point of view of perfectly joining the bumps with the electrode portions 21 of the circuit board 20 which is the aim of the present invention, it is ideal to join the bumps and the electrode portions 21 surely in every state while the contact-areas increase. Since the ultrasonic vibration is applied continuously to the bumps as described above in the embodiment, it is best that the current to be supplied to the voice coil motor 121 is controlled to make constant an increase rate of the contact-areas. As such, information of a relationship of the pressing force, namely, current and the contact-areas is required to be supplied beforehand to the control unit 110 to effect this type of control. The control unit 110 obtains the contact-areas from the current value supplied to the voice coil motor 121, thereby controlling the current to make the change rate of the contact-areas constant, and thus controls the pressing force.

As shown in FIGS. 4 and 14, the bumps 11 are compressed by the pressing action, and the height of each bump 11 in a movement direction of the semiconductor chip 150 held by the nozzle 93 changes accordingly. Therefore, the current to be supplied to the voice coil motor 121 may be controlled to make an increase rate of the height constant. For this control, the control unit 110 needs information of a relationship of the pressing force, i.e., current value and the height beforehand. The control unit 110 obtains the height from the current value supplied to the voice coil motor 121, and controls the current to make the rate of change of the height constant, thereby controlling the pressing force.

Figure 8:
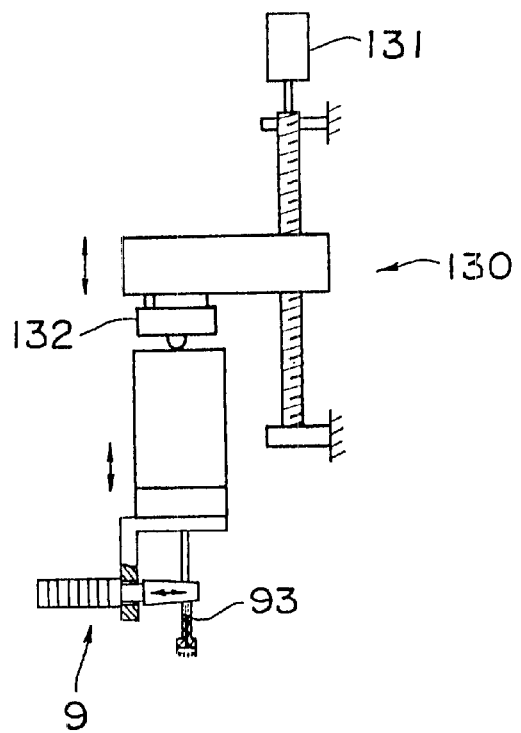
FIG. 8 is a diagram showing a different example of the bump-joining apparatus of FIG. 1.

The voice coil motor 121 is employed as a driving device to move the semiconductor chip 150 in the embodiment. The driving device is not limited to the voice coil motor and can be constituted of, e.g., a ball screw structure 130 of FIG. 8 thereby moving the nozzle 93 by a motor 131. The pressing force may be measured by a load cell 132 in this case.

The operation of the semiconductor component-manufacturing apparatus 101 in the above constitution will be described below.

The circuit board 20 is supplied to the bonding stage 103 by the circuit board transfer apparatus 106, and heated while being sucked on the bonding stage 103. In the meantime, the wafer 112 is moved from the magazine lifter apparatus 111 and mounted to the component feed apparatus 102. The wafer 112 is stretched by the component feed apparatus 102. The component reversal apparatus 104 holds semiconductor chips 150 one by one from the component feed apparatus 102 and turns each semiconductor chip 150 upside down. The X-axis robot 108 is then driven to move the bump-joining apparatus 105 to a position corresponding to the component reversal apparatus 104. The tipped-over semiconductor chip 150 is held by the nozzle 93 of the bump-joining apparatus 105. After the holding, the X-axis robot 108 is driven again to move the bump-joining apparatus 105 to above the bonding stage 103. Then the X-axis robot 108 and Y-axis robot 107 are operated so that the bumps 11 of the semiconductor chip 150 and the electrode portions 21 of the circuit board are arranged to correspond to each other at a position on the circuit board 120 held at the bonding stage 103 where the semiconductor chip 150 is to be joined. The earlier-described joining operation is carried out thereafter, whereby the bumps 11 and electrode portions 21 are joined.

After all semiconductor chips 150 are completely joined on the circuit board 20, the bonding stage 103 is moved to the circuit board transfer apparatus 106 and the circuit board transfer apparatus 106 in turn transfers the circuit board 20 to the next process from the bonding stage 103.

According to the bump-joining apparatus and bump-joining method of the foregoing embodiment, when the bumps 11 are pressed to the electrode portions 21 of the circuit board 20, not only the contact-areas of the bumps 11 to the electrode portions 21 change, but the ultrasonic vibration acts on the bumps 11, 12. Therefore, the bumps 11, 12 can be joined with the electrode portions 21 uniformly throughout the changing of the contact-areas of the bumps 11, 12 by the heat of friction generated from the ultrasonic vibration in addition to the heating by the bonding stage 103. The bumps 12 and electrode portions 21 are joined more firmly than in the conventional art for the whole contact-areas.

Figure 9:
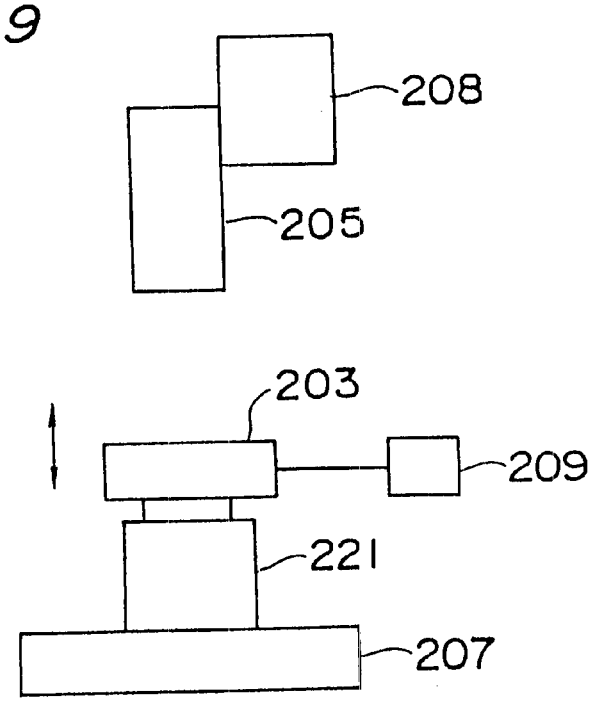
FIG. 9 is a diagram showing a different example of the semiconductor component-manufacturing apparatus of FIG. 1, specifically in the periphery of the bump-joining apparatus and bonding stage.

In the above embodiment, the bump-joining apparatus 105 is moved towards the circuit board 20 to press the bumps 11 to the electrode portions 21. The present invention is not limited to the embodiment. For example, a bump-joining apparatus 205 is fixed when bumps are joined to the electrode portions, a bonding stage 203 and loading the circuit board 20 may be moved to the bump-joining apparatus 205, as shown in FIG. 9. In such example, a voice coil motor 221 may be used as a driving device to move the bonding stage. A movement amount of the bonding stage can be controlled by the current supplied to the voice coil motor 221, similar to the above. In other words, the bump-joining apparatus and the bonding stage loading the circuit board 20 are moved relatively when the bumps are joined to the electrode portions. A reference numeral 207 in FIG. 9 indicates a Y-axis robot, and a reference numeral 208 is an X-axis robot.

Although the ultrasonic vibration is applied to the nozzle 93, the present invention is not restricted to this. Instead, the circuit board 20 may be vibrated by an ultrasonic vibration generation device 209. That is, the bumps 11 and circuit board 20 are vibrated relative to each other.

In the embodiment, the bumps 11 are kept pressed by the bump-joining apparatus 105 to reach the initial contact area. The invention is not limited to this, and the semiconductor chip 150 or the like electronic component preliminarily having the initial contact areas at the leading end portions 11b of the bumps 11 may be sent to the semiconductor component-manufacturing apparatus 101 or bump-joining apparatus 105. In such arrangement, the pressing action and the ultrasonic vibration are started from the time point when the bumps 11 and electrode portions 21 come in contact with each other.

Figure 10:
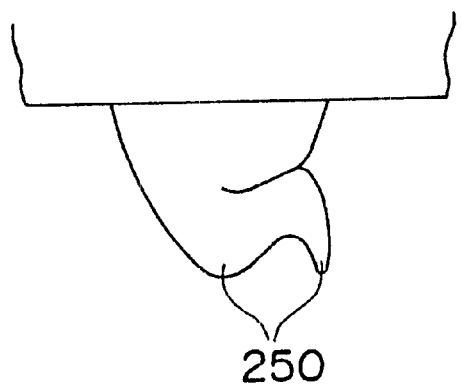
FIG. 10 is a diagram of the bump in a different shape.
Figure 11:
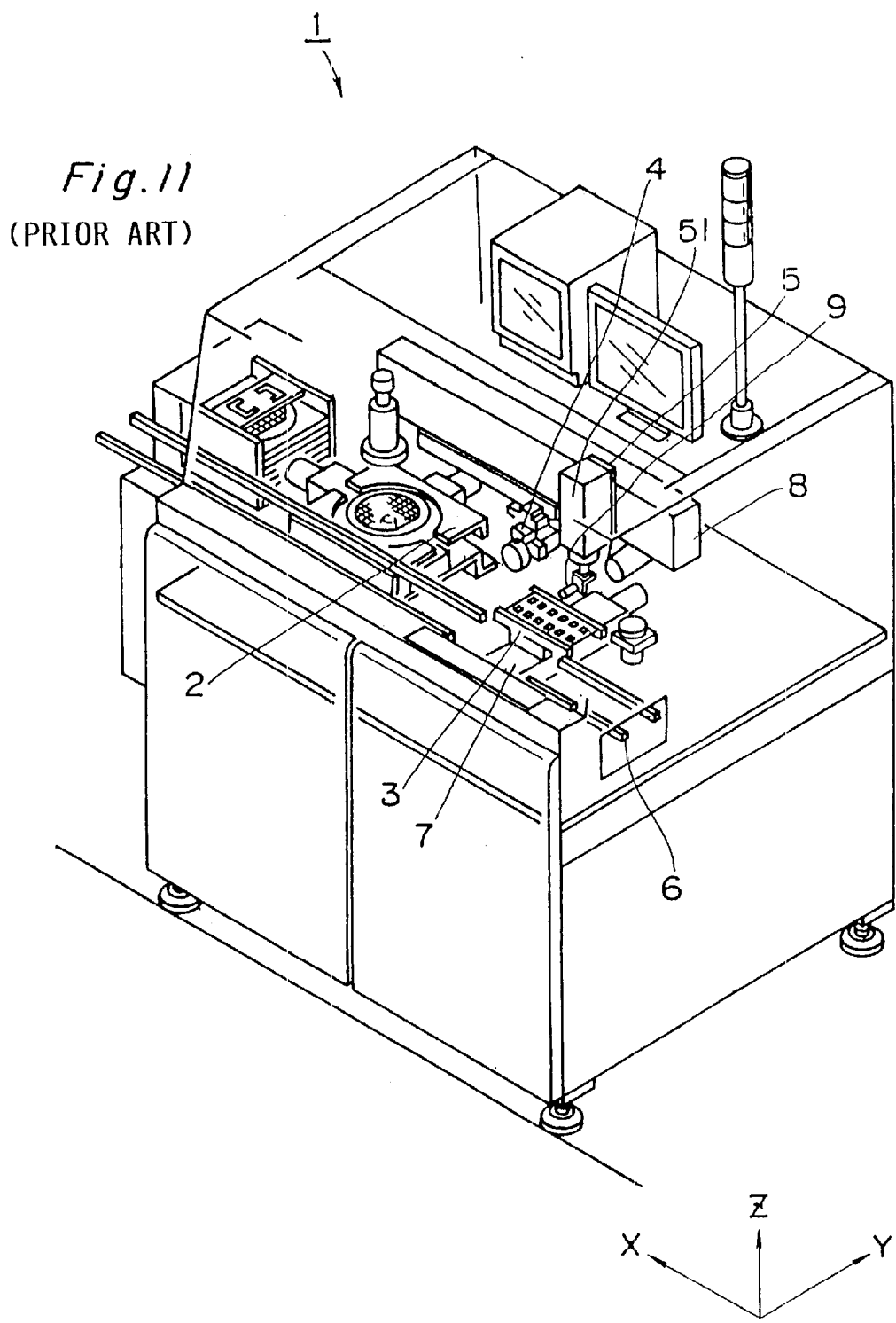
FIG. 11 is a perspective view of an example of a conventional semiconductor component-manufacturing apparatus.

Each bump 11 formed at the semiconductor chip 150 is shaped as illustrated in FIG. 13 in the embodiment. Each bump 11 is not restricted to this form and may, e.g., have a plurality of top portions 250 as shown in FIG. 10.

As described with reference to FIG. 5, according to the present embodiment, the pressing action of the bumps 12 to the electrode portions 21 is terminated and moreover the ultrasonic vibration to the bumps 12 is stopped simultaneously when the contact-areas between the bumps 11 and the electrode portions 21 become the join-completed-contact areas. That is because if the ultrasonic vibration to the bumps 12 is continued for a long time after the completion of the joining, the joined portions sometimes break. For avoiding this, in the embodiment, the ultrasonic vibration is stopped within approximately 0.3 sec after the join-completed-contact areas are obtained.

It is not always necessary for the ultrasonic vibration to start at the time point when the contact-areas become the initial contact areas.

The nozzle 93 is vibrated relatively strongly with the amplitude of 1–2 $\mu$m in the embodiment described above. Thus, before being vibrated, the bumps 11 are compressed to attain the initial contact areas, thereby being prevented from shifting from the electrode portions 21. On the other hand, in the case with no positional shift occurring, for example, when the nozzle is vibrated with a relatively small amplitude of about 0.5 $\mu$m, the bumps 11 and electrode portions 21 may be allowed to be vibrated relative to each other before coming in contact with each other. Even the vibration with the amplitude of 0.5 $\mu$m can generate the heat of friction, ensuring good joining of the bumps 11, 12 with the electrode portions 21.

The following effect is realized when the vibration is carried out before the bumps 11 and electrode portions 21 come in contact with each other. Supposing that three kinds of bumps 11, i.e., high, middle, and low bumps of the height II as shown in FIG. 13 are formed at the semiconductor chip 150, and the ultrasonic vibration is started after the semiconductor chip 150 is pressed to compress the low bump to form the initial contact area, the middle and high bumps are held in contact with the electrode portions 21 with areas not smaller than the initial contact areas of the middle and high bumps at this time. Therefore, the middle and high bumps are harder to vibrate than the low bumps, possibly resulting in insufficient joining at the start of the ultrasonic vibration. To the contrary, any of the low, middle and high bumps can be joined well if the vibration is started before the bumps 11 and electrode portions 21 are brought into contact with each other.

In order to eliminate the probability that the semiconductor chip 150 is separated from the nozzle 93 when the vibration is carried out before the bumps 11 and electrode portions 21 are in contact with each other, a suction force for the semiconductor chip 150 is increased, a friction at a contact face between the semiconductor chip 150 and nozzle 93 is strengthened or the like idea is required in some cases.

Further, an arrangement is adoptable whereby initial vibration not bringing about the positional shift is carried out before the bumps 11 and electrode portions 21 come in contact with each other until the contact-areas of the bumps 11 reach the initial contact areas of the bumps 11, and then constant vibration exceeding the initial vibration, for instance, with an amplitude of 1–2 $\mu$m described earlier is applied after the contact-areas become the initial contact areas until the contact-areas reach the join-completed-contact areas of the bumps 12. Even the initial vibration produces the heat of friction, thereby enabling good joining of the bumps 11, 12 with the electrode portions 21.

Through the above-discussed control of the vibration, the positional shift is avoided and a time required for setting to achieve the initial contact areas is saved, so that a Tact time is shortened and perfect-joining is accomplished. Moreover, the small initial vibration suppresses the danger of the separation of the semiconductor chip 150 from the nozzle 93 even when the vibration is started before the bumps 11 and electrode portions 21 are brought in contact with each other.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A bump-joining method for joining a plurality of bumps formed at an electronic component to electrode portions on a circuit board, said method comprising:

with the plurality of bumps facing the electrode portions, performing a pressing operation to cause relative movement between all of the plurality of bumps together and the electrode portions together so that said plurality of bumps and said electrode portions move in a direction towards each other so as to compress the plurality of bumps so that contact-areas of the bumps to the electrode portions change from initial contact-areas to completed contact-areas at completion of the joining of the bumps to the electrode portions, wherein the completed contact-areas exceed the initial contact-areas; and generating a constant relative vibration between the plurality of bumps and the electrode portions continuously from a time at which the contact-areas reach the initial contact-areas to a time at which the contact-areas reach the completed contact-areas, to thereby join the plurality of bumps to the electrode portions.

2. A bump-joining method according to claim 1, wherein said pressing operation is carried out so that a rate of change of heights of the plurality of bumps in said direction in which said plurality of bumps and said electrode portions move toward each other from the time at which the contact areas reach the initial contact-areas to the time at which the contact-areas reach the completed contact-areas, is constant.

3. A bump-joining method according to claim 1, further comprising, prior to said performing of said pressing operation, manipulating at least one of the electronic component and the circuit board to cause the plurality of bumps to face the electrode portions.

4. A bump-joining method for joining a plurality of bumps formed at an electronic component to electrode portions on a circuit board, said method comprising:

with the plurality of bumps facing the electrode portions, performing a pressing operation to cause relative movement between all of the plurality of bumps together and the electrode portions together so that said plurality of bumps and said electrode portions move in a direction towards each other so as to compress the plurality of bumps so that contact-areas of the bumps to the electrode portions change from initial contact-areas to completed contact-areas at completion of the joining of the bumps to the electrode portions, wherein the completed contact-areas exceed the initial contact-areas;

generating a constant relative vibration between the plurality of bumps and the electrode portions continuously from a time at which the contact-areas reach the initial contact-areas to a time at which the contact-areas reach the completed contact-areas, to thereby join the plurality of bumps to the electrode portions; and wherein said pressing operation is carried out so that a rate of change of the contact-areas from the initial contact-areas to the completed contact-areas is constant.

5. The bump-joining method according to claim 1, further comprising generating no relative vibration between the plurality of bumps and the electrode portions prior to the time at which the contact-areas reach the initial contact-areas.

6. The bump-joining method according to claim 4, further comprising generating no relative vibration between the plurality of bumps and the electrode portions prior to the time at which the contact-areas reach the initial contact-areas.

* * * * *

UNITED STATES PATENT AND TRADEMARK OFFICE
CERTIFICATE OF CORRECTION

PATENT NO.   : 6,572,005 B2
DATED        : June 3, 2003
INVENTOR(S)  : Shozo Minamitani et al.

It is certified that error appears in the above-identified patent and that said Letters Patent is hereby corrected as shown below:

<u>Title page,</u>
Item [75], Inventors, please replace "Tokyonaka" with -- Toyonaka --.
Item [65], Prior Publication Data, please add -- This patent is subject to a terminal disclaimer --.

Signed and Sealed this

Sixteenth Day of March, 2004

JON W. DUDAS
*Acting Director of the United States Patent and Trademark Office*